Figure 1:
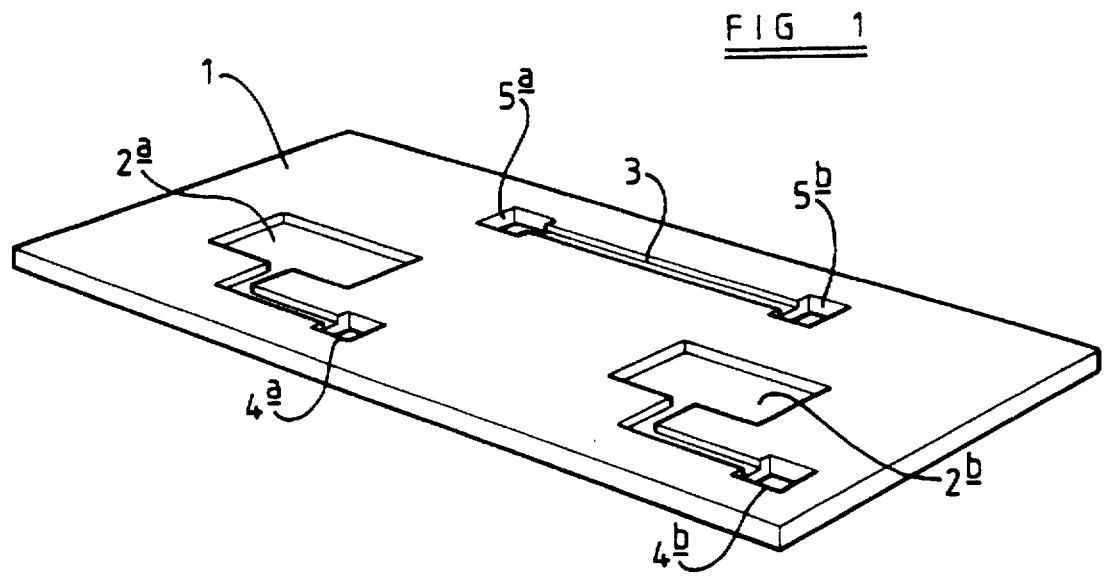

United States Patent [19]

Impey

[11] Patent Number: 5,755,027
[45] Date of Patent: May 26, 1998

[54] MANUFACTURING METHOD FOR ELECTRICAL CIRCUIT BOARD

[75] Inventor: John Impey, Thurnby, England

[73] Assignee: Moulded Circuits Limited, England

[21] Appl. No.: 199,138

[22] PCT Filed: Aug. 28, 1992

[86] PCT No.: PCT/GB92/01593

§ 371 Date: Jun. 17, 1994

§ 102(e) Date: Jun. 17, 1994

[87] PCT Pub. No.: WO93/05633

PCT Pub. Date: Mar. 18, 1993

[30] Foreign Application Priority Data

Aug. 30, 1991 [GB] United Kingdom ............ 9118599

[51] Int. Cl.[6] ............................ H05K 3/10; H05K 1/00
[52] U.S. Cl. ................. 29/849; 174/250; 264/272.14; 264/272.17; 428/901
[58] Field of Search ............................ 29/848, 849, 832; 264/272.14, 272.17; 174/260, 250

[56] References Cited

U.S. PATENT DOCUMENTS

| | | |
|---|---|---|
| 3,158,926 | 12/1964 | Nieter ........................................ 29/848 |
| 4,349,693 | 9/1982 | Hinrichs . |
| 4,402,135 | 9/1983 | Schweingruber et al. ............ 29/848 X |
| 4,438,561 | 3/1984 | Mueller . |
| 4,557,807 | 12/1985 | Preston et al. . |
| 4,689,103 | 8/1987 | Elarde ................................... 29/849 X |
| 4,758,459 | 7/1988 | Mehta ................................... 29/848 X |
| 4,778,641 | 10/1988 | Chia .............................. 264/272.14 X |
| 4,810,831 | 3/1989 | Hendel . |
| 4,980,016 | 12/1990 | Tada et al. .................... 264/272.11 X |
| 5,194,694 | 3/1993 | Hendel et al. ................ 264/272.11 X |

FOREIGN PATENT DOCUMENTS

| | | | |
|---|---|---|---|
| 0256428 | 2/1988 | European Pat. Off. | ......... H05K 3/10 |
| 0442547 | 8/1991 | European Pat. Off. | ........ C08G 61/12 |
| 2336917 | 3/1974 | Germany . | |
| 2072197 | 9/1981 | United Kingdom | .......... C08F 138/02 |

*Primary Examiner*—Carl J. Arbes
*Attorney, Agent, or Firm*—Young & Basile, P.C.

[57] ABSTRACT

A method of producing an electrical circuit board comprises mounting electrically conducting circuit elements moulded from plastics material on a preformed board. The circuit elements are preferably made electrically conducting prior to mounting on the board by plating with an electrical conductor. The method is of particular utility in the manufacture of three-dimensional circuit boards.

7 Claims, 2 Drawing Sheets

MANUFACTURING METHOD FOR ELECTRICAL CIRCUIT BOARD

This invention relates to an improved method for the manufacture of electrical circuit boards, and to electrical circuit boards produced by that method. The method is of particular utility in the manufacture of three-dimensional circuit boards.

Printed circuit boards are of immense importance in many areas of modern industry, and such boards moulded from plastics material are of increasing interest. Moulded circuit boards are usually prepared by plating a board, usually of a high-melting plastics material, with a metal, most commonly copper. The desired circuit pattern is then imaged on the plated board and etched. This process suffers from the disadvantage that the various stages, notably imaging, are complex and expensive to perform.

Three-dimensional circuit boards are increasingly important. Such boards have hitherto been manufactured by the method used for planar boards as described above, ie by imaging and etching the desired circuit pattern. Great difficulties are, however, encountered in the imaging of the circuit pattern on a three-dimensional circuit board.

There has now been devised a method of producing an electrical circuit board which overcomes or substantially mitigates the above-mentioned disadvantages.

According to the invention there is provided a method of producing an electrical circuit board comprising electrically conducting circuit elements mounted on a pre-formed board, which method comprises the steps of a) moulding the circuit elements in a plastics material,
b) plating the moulded circuit elements with an electrical conductor, and
c) mounting the plated circuit elements on the pre-formed board.

The method according to the invention is advantageous primarily in that it is simple and relatively inexpensive to carry out. In particular, it eliminates the need for imaging and etching of the desired circuit pattern. The method is therefore of particular utility in the manufacture of three-dimensional circuit boards, for which these processes are particularly difficult.

Circuit boards prepared by the method of the invention and the electrically conducting mouldings used in the method are also novel, and represent further aspects of the present invention.

Conveniently, the circuit elements are moulded on a runner of plastics material from which they can readily be detached by the application of mechanical force. Most conveniently, for the greatest ease of assembly, the elements for a particular circuit are moulded such that the relative disposition of the elements on the runner is the same or similar to the relative disposition of the elements in the finished circuit board.

It may be necessary or desirable for more than one conducting moulding to be fitted to one board, eg in the manufacture of relatively complex circuitry. The conducting mouldings may be fitted to different areas of the board, or may be fitted to adjacent areas and may interlock.

Mounting of the plated circuit elements on the pre-formed board may be carried out by various means. Preferably, however, the board is formed with apertures and/or recesses to receive the circuit elements. Most preferably, the circuit elements have a snap or interference fit with such recesses or apertures.

The circuit elements may be formed with sockets or connectors to receive electrical components such as resistors or chokes, or for connection to an external circuit or power supply.

The materials which way be employed in the manufacture of the circuit elements and the pre-formed board, as well as the moulding and plating techniques employed, may be generally conventional and will be apparent to those skilled in the art.

Figure 2:
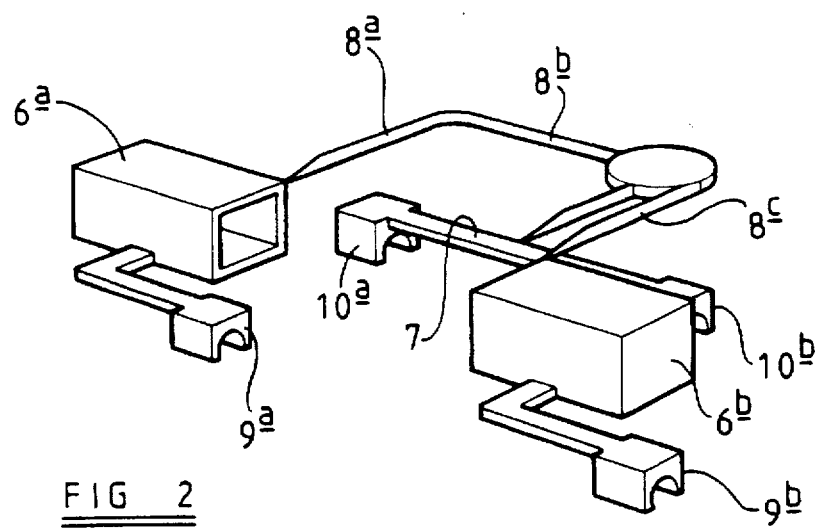
Figure 3:
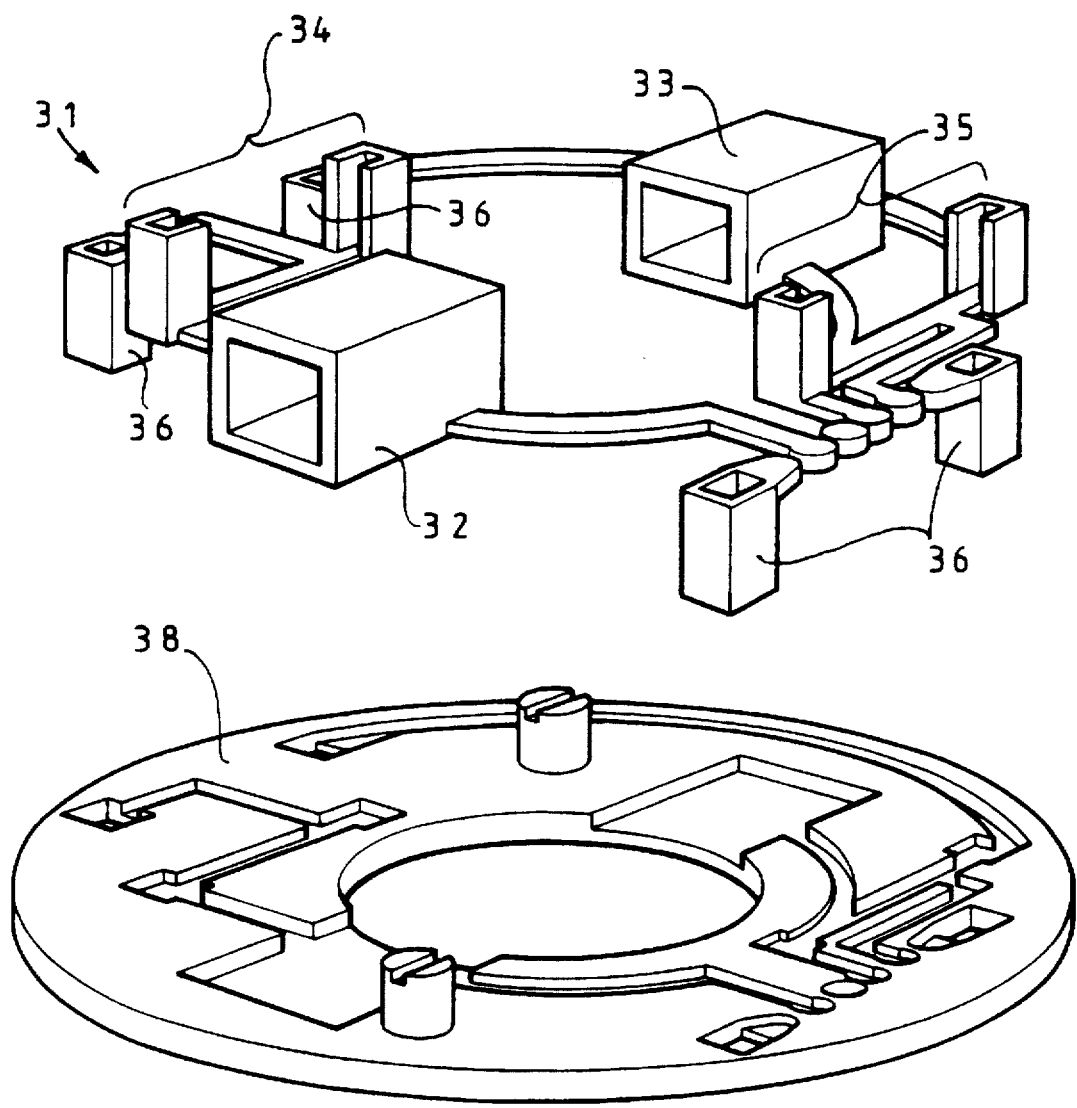

The invention will now be described in more detail, by way of example only, with reference to the accompanying drawings in which FIG. 1 is a perspective view of a pre-formed board forming part of a circuit board prepared in accordance with the present invention, FIG. 2 is a perspective view of a set of moulded plastics circuit elements intended to be fitted to the board of FIG. 1, and FIG. 3 is a perspective view of moulded components and a pre-formed board which together form a second embodiment of the invention.

Referring first to FIG. 1, a pre-formed board comprises a substantially planar plate 1 of high-melting plastics material, formed with recesses 2a,2b,3 to receive moulded circuit elements, and apertures 4a,4b,5a,5b through which circuit elements may project to the underside of the plate 1.

As shown in FIG. 2, circuit elements to be fitted to the board of FIG. 1 are moulded in plastics material. The circuit elements 6a,6b,7 are frangibly connected by runners 8a,8b, 8c and are held in similar relative disposition to that which they will have when fitted to the plate 1, The assembly of circuit elements 6a,6b,7 and runners 8a,8b,8c is plated with a thin coating of copper by conventional means, and then fitted to the plate 1. Element 6a, for example, has a close fit with the recess 2a, a connector 9a passing through the aperture 4a. Similarly, element 6b fits recess 2b with connector 9b passing through the aperture 4b. The element 7 likewise fits into the recess 3 with connectors 10a,10b formed at its ends passing through the apertures 5a,5b.

After fitting of the circuit elements 6a,6b,7 to the plate 1, the runners 8a,8b,8c are removed, eg by a simple twisting action.

The connectors 9a,9b,10a,10b are used to connect additional electrical components, eg resistors or chokes, or to connect the assembled circuit board to external circuitry.

FIG. 3 shows moulded components, generally designated 31, and a pre-formed board 38 which together form a circuit board for use in all electric hand drill having a DC motor. The components 31 include carbon brush holders 32,33 and choke holders 34,35. Connectors 36 are provided for connection of the circuit board to external circuitry.

As before, the components 31 are plated with a thin coating of copper and then fitted to the hoard 38, which is moulded with appropriately formed recesses and apertures to receive the various components.

I claim:

1. A plurality of electrically conducting circuit elements, moulded from plastics material which is plated with an electrical conductor, the elements being disposed on a plastics runner from which they can be detached by the application of mechanical force.

2. A method of producing an electrical circuit board comprising electrically conducting circuit elements mounted on a pre-formed board, which method comprises the steps of a) moulding the circuit elements in a plastics material, b) plating the moulded circuit elements with an electrical conductor, and c) mounting the plated circuit elements on the pre-formed board.

3. A method as claimed in claim 2, wherein the circuit elements are moulded on a runner of plastics material from which they can be detached by the application of mechanical force.

4. A method as claimed in claim 3, wherein the circuit elements for a particular circuit are moulded such that the relative disposition of the circuit elements on the runner is the same or similar to the relative disposition of the circuit elements in the finished circuit board.

5. The method as claimed in claim 2, wherein more than one conducting moulding is fitted to the board.

6. The method as claimed in claim 2, wherein the board is formed with apertures and/or recesses with which the circuit elements have a snap or interference fit.

7. The method as claimed in claim 2, wherein the circuit elements are formed with sockets or connectors to receive electrical components or for connection to an external circuit or power supply.

* * * * *